United States Patent
Lee et al.

(10) Patent No.: US 7,449,763 B2
(45) Date of Patent: Nov. 11, 2008

(54) METHOD OF FABRICATING CELL OF NONVOLATILE MEMORY DEVICE WITH FLOATING GATE

(75) Inventors: Chang-Hyun Lee, Kyunggi-do (KR); Kyu-Charn Park, Kyunggi-do (KR); Jeong-Hyuk Choi, Kyunggi-do (KR); Sung-Hoi Hur, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/530,827

(22) Filed: Sep. 11, 2006

(65) Prior Publication Data

US 2007/0029603 A1    Feb. 8, 2007

Related U.S. Application Data

(60) Continuation of application No. 10/788,002, filed on Feb. 25, 2004, now Pat. No. 7,122,426, which is a division of application No. 10/346,957, filed on Jan. 17, 2003, now Pat. No. 6,903,406.

(30) Foreign Application Priority Data

Feb. 8, 2002    (KR)    .................. 2002-7297

(51) Int. Cl.
  *H01L 29/00* (2006.01)
  *H01L 29/76* (2006.01)
  *H01L 29/94* (2006.01)
  *H01L 31/062* (2006.01)
  *H01L 31/113* (2006.01)
  *H01L 31/119* (2006.01)

(52) U.S. Cl. ........................ 257/506; 257/374; 257/501; 257/510; 257/524; 257/905

(58) Field of Classification Search ................. 257/374, 257/501, 506, 510, 524, 905
See application file for complete search history.

(56) References Cited

U.S. PATENT DOCUMENTS 4,849,369 A    7/1989    Jeuch et al. .................. 438/257

(Continued)

FOREIGN PATENT DOCUMENTS

| JP | 8-172174 | 7/1996 |
| KR | 2001-006386 | 7/2001 |

OTHER PUBLICATIONS

English language abstract of Japanese Publication No. 8-172174.

(Continued)

*Primary Examiner*—Ida M Soward
(74) *Attorney, Agent, or Firm*—Marger Johnson & McCollom, P.C.

(57) ABSTRACT

This disclosure provides cells of nonvolatile memory devices with floating gates and methods for fabricating the same. The cell of the nonvolatile memory device includes device isolation layers in parallel with each other on a predetermined region of a semiconductor substrate that define a plurality of active regions. Each device isolation layer has sidewalls that project over the semiconductor substrate. A plurality of word lines crosses over the device isolation layers. A tunnel oxide layer, a floating gate, a gate interlayer dielectric layer, and a control gate electrode are sequentially stacked between each active region and each word line. The floating gate and the control gate electrode have sidewalls that are self-aligned to the adjacent device isolation layers. The method for forming the self-aligned floating gate and the control gate electrode includes forming trenches in a semiconductor substrate to define a plurality of active regions and concurrently forming an oxide layer pattern, a floating gate pattern, a dielectric layer pattern and a control gate pattern that are sequentially stacked. A conductive layer is then formed on the device isolation layers and the control gate pattern. Thereafter, the conductive layer, the control gate pattern, the dielectric layer pattern, the floating gate pattern, and the oxide layer pattern are successively patterned.

10 Claims, 10 Drawing Sheets

U.S. PATENT DOCUMENTS

| | | | |
|---|---|---|---|
| 5,208,179 A | 5/1993 | Okazawa | 438/424 |
| 5,268,320 A | 12/1993 | Holler et al. | 438/591 |
| 5,278,438 A | 1/1994 | Kim et al. | 257/316 |
| 5,843,820 A * | 12/1998 | Lu | 438/243 |
| 5,886,368 A | 3/1999 | Forbes et al. | 257/77 |
| 5,998,264 A | 12/1999 | Wu | 438/260 |
| 6,034,393 A * | 3/2000 | Sakamoto et al. | 257/315 |
| 6,171,909 B1 | 1/2001 | Ding et al. | 438/267 |
| 6,222,225 B1 * | 4/2001 | Nakamura et al. | 257/315 |
| 6,235,589 B1 | 5/2001 | Meguro | 438/267 |
| 6,441,421 B1 | 8/2002 | Clevenger et al. | 257/296 |
| 6,444,592 B1 | 9/2002 | Ballantine et al. | 438/770 |
| 6,548,374 B2 * | 4/2003 | Chung | 438/243 |
| 6,586,804 B2 * | 7/2003 | Choi et al. | 257/374 |
| 6,720,610 B2 * | 4/2004 | Iguchi et al. | 257/315 |
| 6,803,272 B1 | 10/2004 | Halliyal et al. | 438/240 |
| 6,855,591 B2 * | 2/2005 | Kim | 438/221 |
| 6,921,947 B2 * | 7/2005 | Furuta et al. | 257/368 |
| 6,927,447 B2 * | 8/2005 | Choi et al. | 257/315 |
| 7,038,291 B2 * | 5/2006 | Goda et al. | 257/510 |
| 7,388,249 B2 * | 6/2008 | Lee | 257/314 |
| 2003/0020119 A1 * | 1/2003 | Arai et al. | 257/365 |
| 2003/0227042 A1 * | 12/2003 | Hibi et al. | 257/296 |

OTHER PUBLICATIONS

English language abstract of Korean Publication No. 2001-006386.
O'Connor, Kevin J., et al., "A Novel CMOS Compatible Stacked Floating Gate Device Using Tin as a Control Gate," Jan. 1997 Symposium on VLSI Technology Digest of Technical Papers, pp. 61-62.
Momiyama, Youichi, et al., "Ultra-Thin $TA_2O_5/SIO_2$ Gate Insulator With Tin Gate Technology for 0.1 μm MOSFETS," Jan. 1997 Symposium on VLSI Technology Digest of Technical Papers, pp. 135-136.

* cited by examiner

METHOD OF FABRICATING CELL OF NONVOLATILE MEMORY DEVICE WITH FLOATING GATE

CROSS REFERENCE TO RELATED APPLICATIONS

This application is a Continuation of U.S. patent application Ser. No. 10/788,002, filed on Feb. 25, 2004, now issued U.S. Pat. No. 7,122,426, which is a Divisional of U.S. patent application Ser. No. 10/346,957, filed on Jan. 17, 2003, now issued U.S. Pat. No. 6,903,406, which claims priority from Korean Patent Application No. 2002-07297, filed on Feb. 8, 2002, all of which are herein incorporated by reference in their entirety.

BACKGROUND OF THE INVENTION

1. Technical Field of the Invention

The present invention relates to semiconductor devices and methods for fabricating the same. More specifically, the present invention relates to cells of nonvolatile memory devices with floating gates and methods for fabricating the same.

2. Description of the Related Art

Memory devices like Dynamic Random Access Memory cells (DRAMs) have an advantage over Static Random Access Memory cells (SRAMs) in that they possess higher integration levels, In the DRAMs, however, memory cells should be periodically refreshed in order to prevent erasure of data stored in the cells. As a result, even in a stand-by mode, power dissipation increases. By comparison, in the case of nonvolatile memory devices like SRAMs, memory cells need not be refreshed.

FIG. 1 is a top plan view of a cell of a conventional flash memory device, which is a typical nonvolatile memory device.

FIGS. 2 and 3 are cross-sectional views of the cell of the conventional flash memory device of FIG. 1, the cross-sectional views taken along lines I-I' and II-II' of FIG. 1, respectively.

Referring to FIGS. 1 through 3, device isolation layers 4 are disposed at a predetermined region of a semiconductor substrate to define a plurality of active regions 3. Word lines 14, which are parallel with each other, cross over the device isolation layers 4. A floating gate 16 is located between each word line 14 and each active region 3. A tunnel oxide layer 6 is located between each floating gate 16 and each active region 3, and a gate interlayer dielectric layer 12 is between each floating gate 16 and each word line 14. Each device isolation layer 4 projects over the semiconductor substrate 2 to form sloping sidewalls where the device isolation layer 4 meets the semiconductor substrate 2.

In the conventional nonvolatile memory device, each floating gate 16 includes a lower floating gate 8 spanning adjacent device isolation layer 4 and an upper floating gate 10 partially overlapping the device isolation layer 4. Thus, a top surface and sidewalls of the upper floating gate 8 are covered with the gate interlayer dielectric layer 12. The interlayer dielectric layer 12 is typically made of an oxide-nitride-oxide (ONO) layer. The conventional nonvolatile memory device includes an upper floating gate 10 having high sidewalls in order to increase the surface contact area with the gate interlayer insulation layer 12, which is between the floating gate 16 and a control gate electrode. Thus, the coupling ratio is increased, allowing the voltages for writing and erasing data to be lowered. Unfortunately, processes may be unstable due to step coverage between a cell array region and a peripheral circuit region, and additional processes may be required to form the upper floating gate 10.

BRIEF SUMMARY OF THE INVENTION

It is a feature of the present invention to provide a nonvolatile memory device and a method for fabricating the same that reduces the step coverage between a cell array region and a peripheral circuit region while maintaining a high coupling ratio.

It is another feature of the present invention to provide a nonvolatile memory device and a method for fabricating the same that simplifies the fabrication process for a floating gate.

The present invention, therefore, provides a cell for a nonvolatile memory device with a gate interlayer insulation layer of high dielectric constant and a method for fabricating the same.

The cell of the memory device includes device isolation layers that define a plurality of active regions disposed in parallel with each other at a predetermined region of a semiconductor substrate. Each device isolation layer has sidewalls that project over the semiconductor substrate. A plurality of word lines crosses over the device isolation layers. A tunnel oxide layer, a floating gate, a gate interlayer dielectric layer, and a control gate electrode are sequentially stacked and placed between each active region and each word line. According to the present invention, the tunnel oxide layer, the floating gate, the gate interlayer dielectric layer, and the control gate electrode have sidewalls that are self-aligned with the adjacent device isolation layers.

The present invention also provides a method for fabricating a nonvolatile memory device that includes forming trenches in a semiconductor substrate to define a plurality of active regions and concurrently forming a stacked pattern on each active region. The stacked pattern includes an oxide layer pattern, a floating gate pattern, a dielectric layer pattern, a control gate pattern, and a hard mask pattern that are sequentially stacked. A device isolation layer is formed to fill a volume of the trench between the stacked patterns as well as a region between the stacked patterns. The hard mask pattern is removed and a conductive layer is formed on an entire surface of the substrate. The conductive layer, the control gate pattern, the dielectric layer pattern, the floating gate pattern, and the oxide layer pattern are successively patterned to form word lines that cross over the device isolation layers and are parallel with each other. These layers concurrently form a tunnel oxide layer, a floating gate, a gate interlayer dielectric layer, and a control gate electrode that are sequentially stacked between each active region and each word line.

More specifically, forming the trenches includes sequentially forming an oxide layer, a floating gate layer, a dielectric layer, a control gate layer, and a hard mask layer on a semiconductor substrate, then successively patterning the layers in reverse order. As a result, a sequentially stacked pattern that includes an oxide layer pattern, a floating gate pattern, a dielectric layer pattern, a control gate pattern, and a hard mask pattern is formed on an active region between the trenches.

As described above, the method for fabricating the cell of the conventional nonvolatile memory device includes forming a device isolation layer followed by forming an upper floating gate pattern with high sidewalls. On the other hand, in case of the nonvolatile memory device according to the invention, when the trench is formed, the floating gate pattern and the control gate pattern are concurrently formed on the active region. Therefore, the fabricating processes are simplified and the step coverage between a cell array region and a peripheral circuit region is reduced.

In the invention, the gate interlayer dielectric layer may be composed of high k-dielectric materials, such as metal oxides from the group III or group VA elements in the Mendeleev Periodic Table, or from materials obtained by doping elements from group IV into the said metal oxides. For example, the gate interlayer dielectric layer may be composed of at least one substance selected from the group consisting of aluminum oxide, yttrium oxide, tantalum pentaoxide, vanadium pentaoxide, hafnium aluminate, and hafnium silicate. In addition, the gate interlayer dielectric layer may be obtained by doping zirconium, silicon, titanium, or hafnium into one substance selected from the group consisting of aluminum oxide, yttrium oxide, tantalum pentaoxide, and vanadium pentaoxide. Furthermore, to form the gate interlayer dielectric layer, a silicon oxide layer and a layer composed of one substance selected from among the previously enumerated high k-dielectric materials may be sequentially stacked. In other words, a silicon oxide layer, a high k-dielectric layer, and a silicon oxide layer may be sequentially stacked.

DETAILED DESCRIPTION OF THE INVENTION

Figure 1:
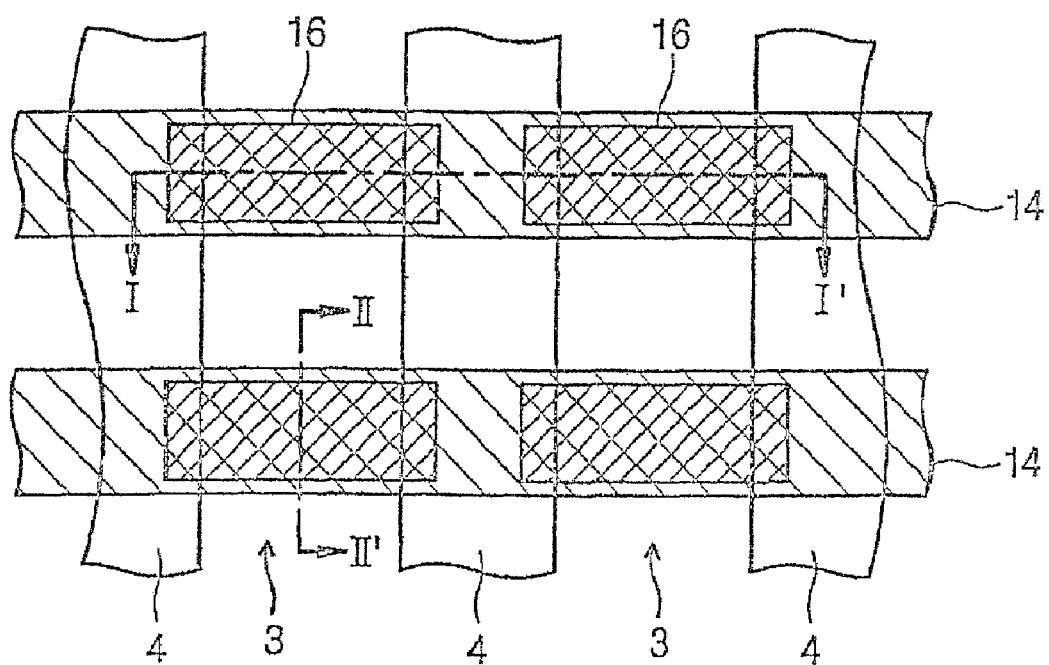
FIG. 1 is a top plan view of a cell of a conventional flash memory device.
Figure 2:
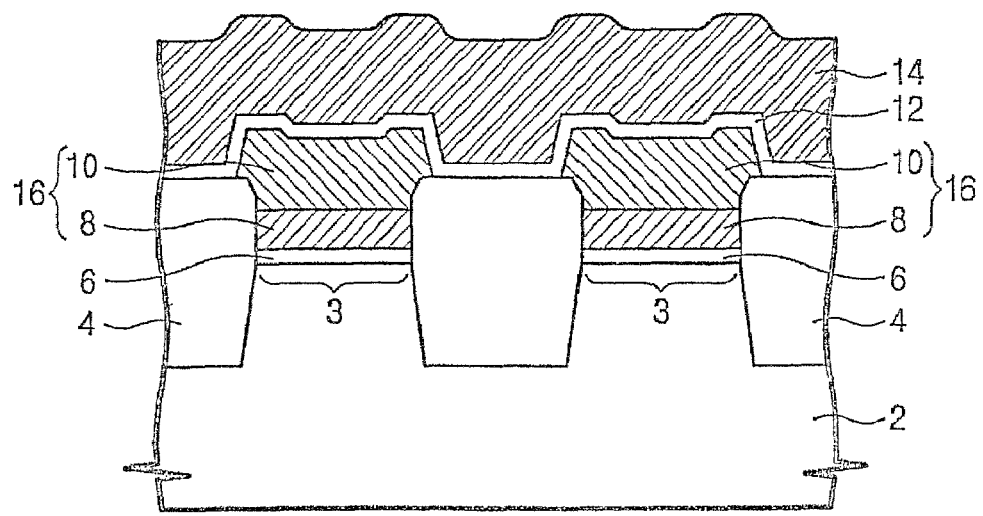
FIG. 2 is a cross-sectional view of the cell of the conventional flash memory device from FIG. 1 taken along line I-I' of FIG. 1.
Figure 3:
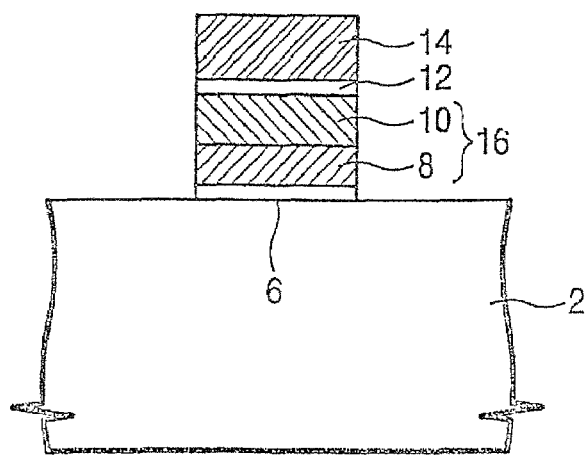
FIG. 3 is a cross-sectional view of the cell of the conventional flash memory device from FIG. 1 taken along line II-II' of FIG. 1.

The invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 4:
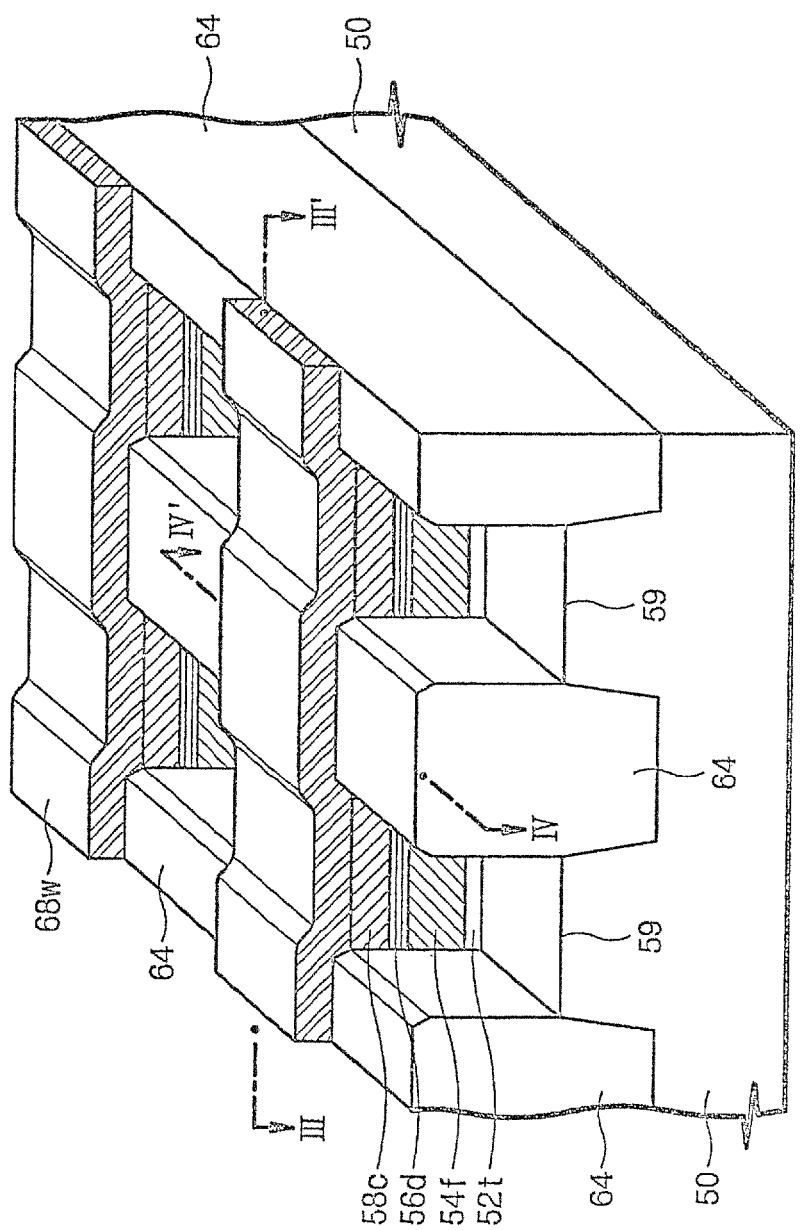
FIG. 4 is a perspective view of a portion of a cell of a nonvolatile memory device according to a preferred embodiment of the present invention.

FIG. 4 is a perspective view of a portion of a cell of a nonvolatile memory device according to a preferred embodiment of the invention.

Referring to FIG. 4, the cell of the nonvolatile memory device includes device isolation layers 64 disposed at a predetermined region of a semiconductor substrate 50 to define a plurality of active regions 59. A plurality of word lines 68w that are parallel to each other cross over the device isolation layers 64. A tunnel oxide layer 52t, a floating gate 54f, a gate interlayer dielectric layer 56d, and a control gate electrode 58c are sequentially stacked between each active region 59 and each word line 68w. Each device isolation layer 64 has sloping sidewalls that extend over the semiconductor substrate 50 such that the width of the device isolation layers 64 becomes smaller as the device isolation layer 64 extends deeper into the semiconductor substrate 50. The tunnel oxide layer 52t, the floating gate 54f, the gate interlayer dielectric layer 56d, and the control gate electrode 58c are sequentially stacked and disposed between the sidewalls of the adjacent device isolation layers 64. The height of the sidewalls of the device isolation layers 64 is greater than the combined heights of the tunnel oxide layer 52t, the floating gate 54f, the gate interlayer dielectric layer 56d, and the control gate electrode 58c.

Each floating gate 54f and each control gate electrode 58c may be composed of polysilicon, and each word line 68w may be composed of polysilicon or metal polycide. Also, the gate interlayer dielectric layer 56d may be composed of high k-dielectric materials, such as metal oxides from the group III or group VA elements in the Mendeleev Periodic Table, or materials obtained by doping group IV elements into said metal oxides. For example, the gate interlayer dielectric layer 56d may be composed of at least one material selected from the group consisting of aluminum oxide, yttrium oxide, tantalum pentaoxide, vanadium pentaoxide, hafnium aluminate, and hafnium silicate. In addition, the gate interlayer dielectric layer 56d may be obtained by doping zirconium, silicon, titanium, or hafnium into a material selected from the group consisting of aluminum oxide, yttrium oxide, tantalum pentaoxide, and vanadium pentaoxide. Furthermore, to form the gate interlayer dielectric layer 56d, a silicon oxide layer and a layer composed of a material selected from the previously enumerated high k-dielectric materials may be sequentially stacked. Alternately, a silicon oxide layer, a high k-dielectric layer, and a silicon oxide layer may be sequentially stacked.

FIGS. 5A, 6A, 7A, 8A and 9A are cross-sectional views for illustrating a method for fabricating a cell of a nonvolatile memory device according to a preferred embodiment of the present invention, the cross-sectional views taken along line III-III' of FIG. 4.

FIGS. 5B, 6B, 7B, 8B and 9B are cross-sectional views for illustrating the method for fabricating the cell of the nonvolatile memory device according to the preferred embodiment of the present invention, the cross-sectional views taken along line IV-IV' of FIG. 4.

Figure 5A:
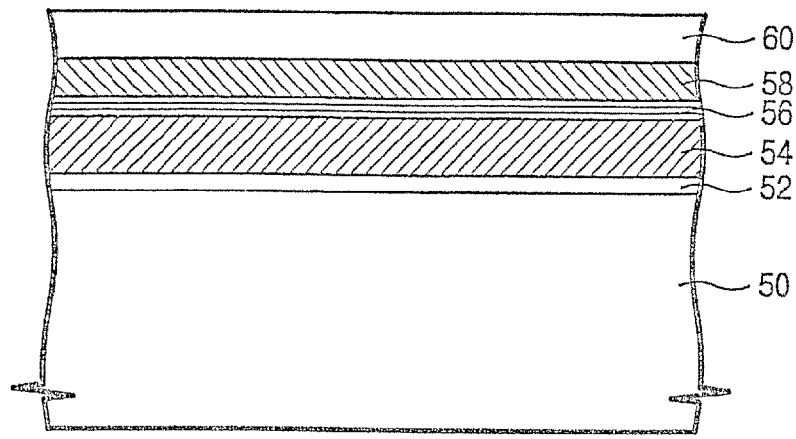
FIGS. 5A, 6A, 7A, 8A and 9A are cross-sectional views for illustrating a method for fabricating a cell of a nonvolatile memory device according to a preferred embodiment of the present invention, the cross-sectional views taken along line III-III' of FIG. 4.
Figure 5B:
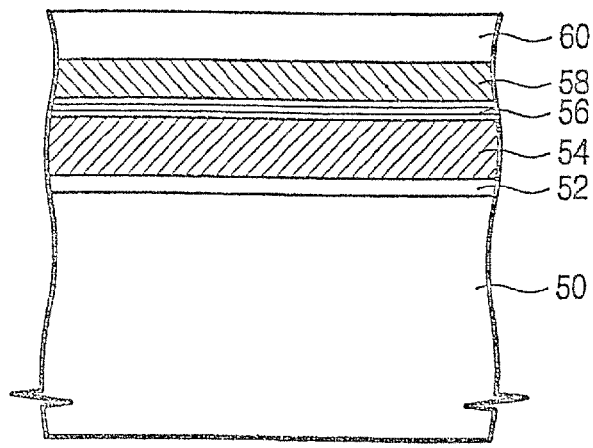
FIGS. 5B, 6B, 7B, 8B and 9B are cross-sectional views for illustrating a method for fabricating the cell of the nonvolatile memory device according to a preferred embodiment of the present invention, the cross-sectional views taken along line IV-IV' of FIG. 4.

Referring to FIGS. 5A and 5B, the method for fabricating the cell of the nonvolatile memory device according to a preferred embodiment of the invention includes sequentially forming an oxide layer 52, a floating gate layer 54, a dielectric layer 56, a control gate layer 58, and a hard mask layer 60 on a semiconductor substrate 50. The floating gate layer 54 and the control gate layer 58 are preferably composed of polysilicon, and the hard mask layer 60 is preferably a silicon nitride layer.

The dielectric layer 56 may include at least one layer composed of a high k-dielectric material whose dielectric constant is higher than that of a silicon nitride layer, i.e., one of the metal oxides elements of the group III or VA elements in the Mendeleev Periodic Table, or one of materials obtained by doping elements of the group IV into said metal oxides. For example, the dielectric layer 56 may be composed of a material selected from the group consisting of aluminum oxide, yttrium oxide, tantalum pentaoxide, vanadium pentaoxide, hafnium aluminate, and hafnium silicate. In addition, the dielectric layer 56 may be obtained by doping zirconium, silicon, titanium, or hafnium into a material selected from the group consisting of aluminum oxide, yttrium oxide, tantalum pentaoxide, and vanadium pentaoxide. Furthermore, to form the dielectric layer 56, a silicon oxide layer and a layer composed of one selected from the enumerated high k-dielectric materials may be sequentially stacked. Alternately, a silicon oxide layer, a high k-dielectric layer, and a silicon oxide layer may be sequentially stacked.

Figure 6A:
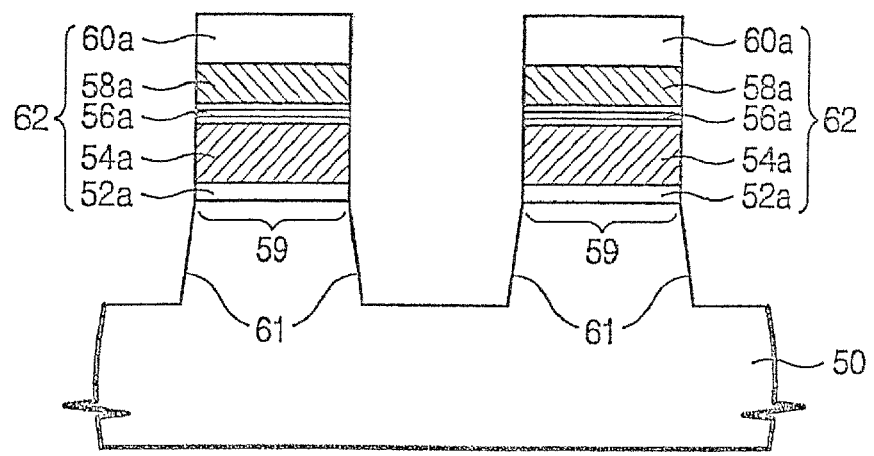
Figure 6B:
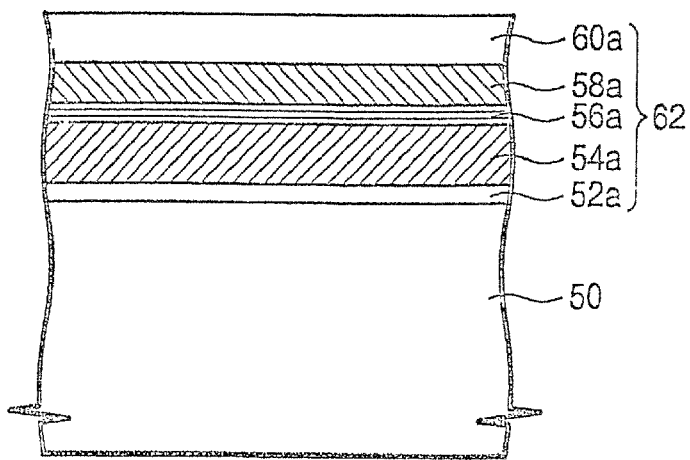

Referring to FIGS. 6A and 6B, the hard mask layer 60, the control gate layer 58, the dielectric layer 56, the floating gate layer 54, the oxide layer 52, and the semiconductor substrate 50 are successively patterned to form trenches 61 in the semiconductor substrate 50 to define a plurality of active regions 59. As a result, a stacked pattern 62 including an oxide layer pattern 52a, a floating gate pattern 54a, a dielectric layer pattern 56a, a control gate pattern 58a, and a hard mask pattern 60a is formed on the active region 59.

Figure 7A:
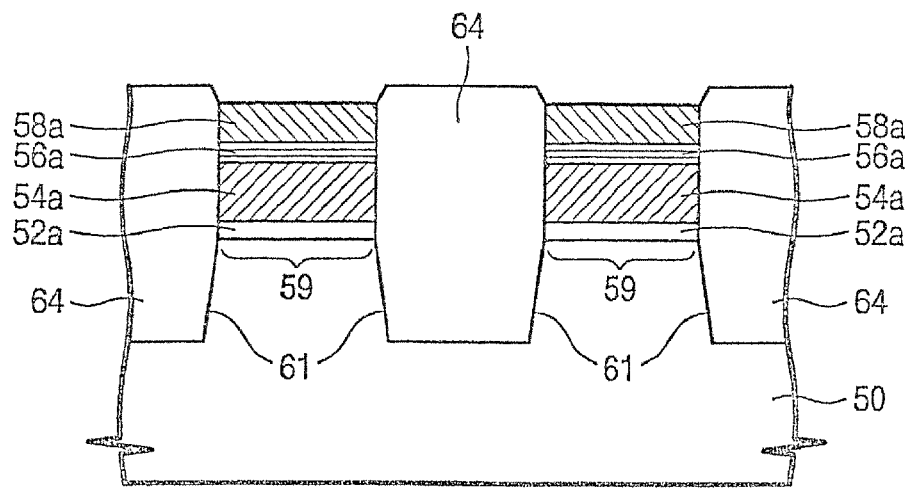
Figure 7B:
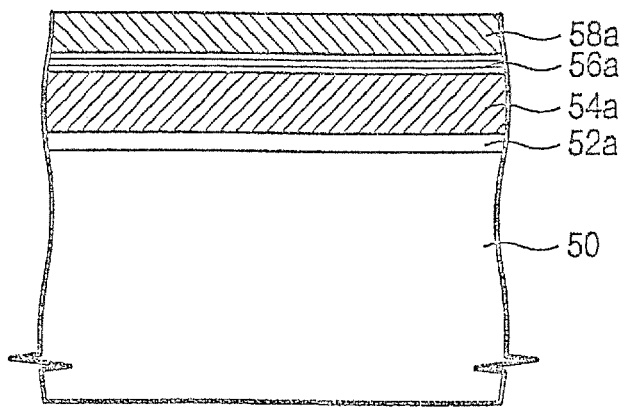

Referring to FIGS. 7A and 7B, an insulation layer (not shown) is formed on an entire surface of the substrate 50 to fill the trenches 61 as well as cover the region between the stacked patterns 62. The insulation layer is then polished using chemical mechanical polishing (CMP) until the hard mask patterns (60a of FIG. 6) are exposed. The hard mask patterns (60a of FIG. 6) are then removed with the same CMP process to expose the control gate patterns 58a. As a result, device isolation layers 64 are formed to fill the trench 61 as shown in FIGS. 7A and 7B. Each device isolation layer 64 has sloping sidewalls that extend over the semiconductor substrate 50 such that the width of the device isolation layers 64 becomes smaller as the device isolation layer 64 extends deeper into the semiconductor substrate 50. The oxide layer pattern 52a, the floating gate pattern 54a, the dielectric layer pattern 56a, and the control gate pattern 58a are sequentially stacked and have sidewalls that are self-aligned to the device isolation layer patterns 64. At this time, the sidewall height of the device isolation layers 64 are greater than the combined heights of the oxide layer pattern 52a, the floating gate pattern 54a, the dielectric layer pattern 56a, and the control gate pattern 58a. That is, the floating gate pattern 54a and the control gate pattern 58a exist only in a region between the device isolation layers 64.

Figure 8A:
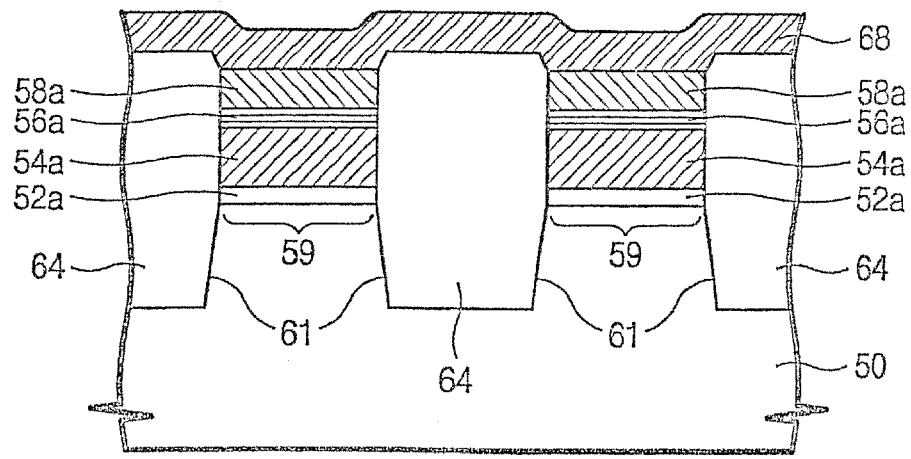
Figure 8B:
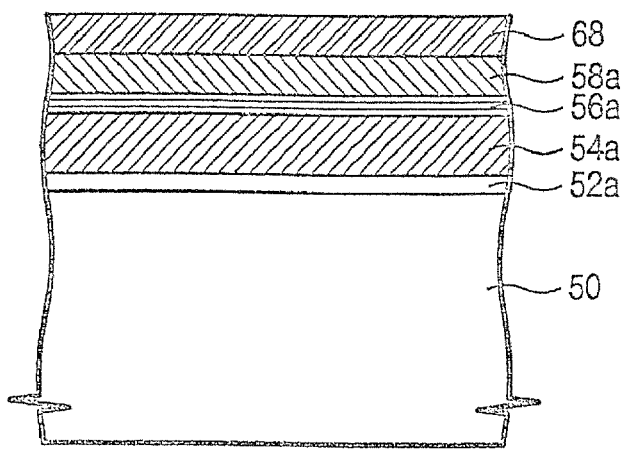

Referring to FIGS. 8A and 8B, a conductive layer 68 is formed on the device isolation layers 64 and the control gate patterns 58a. The conductive layer 68 is preferably composed of polysilicon or metal polycide. The conductive layer 68, the control gate pattern 58a, the dielectric layer pattern 56a, and the floating gate pattern 54a are successively patterned to form a word line 68w, illustrated in FIGS. 9A and 9B.

Figure 9A:
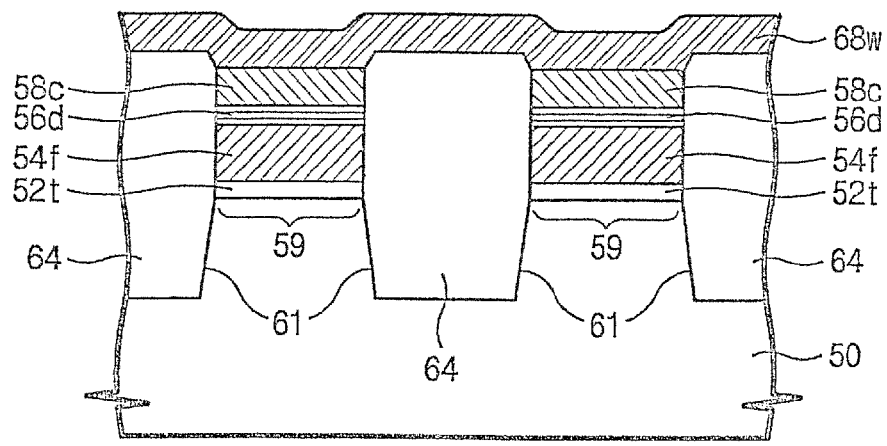
Figure 9B:
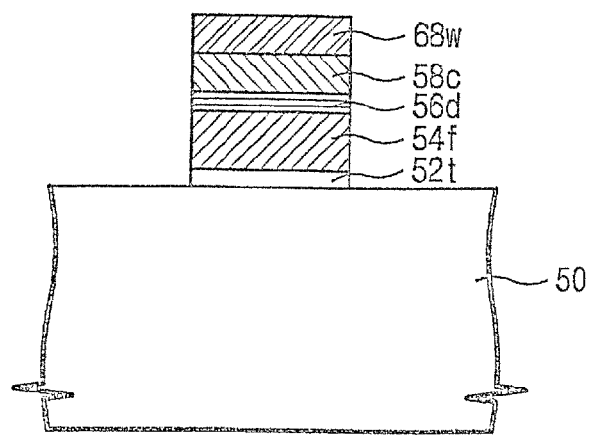

With reference to FIGS. 9A and 9B, word line 68w crosses over the device isolation layers 64. A tunnel oxide layer 52t, a floating gate 54f, a gate interlayer dielectric layer 56d, and a control gate electrode 58c are sequentially stacked between each active region 59 and the control gate electrode 58c. The tunnel oxide layer 52t, the floating gate 54f, the gate interlayer dielectric layer 56d, and the control gate electrode 58c are between the device isolation layers 64. The device isolation layers 64 extend over the semiconductor substrate 50. That is, in a cross-sectional view parallel with the word line, the tunnel oxide layer 52t, the floating gate 54f, the gate interlayer dielectric layer 56d, and the control gate electrode 58c include sidewalls, each of which is self-aligned to the adjacent device isolation layers 64.

Figure 10:
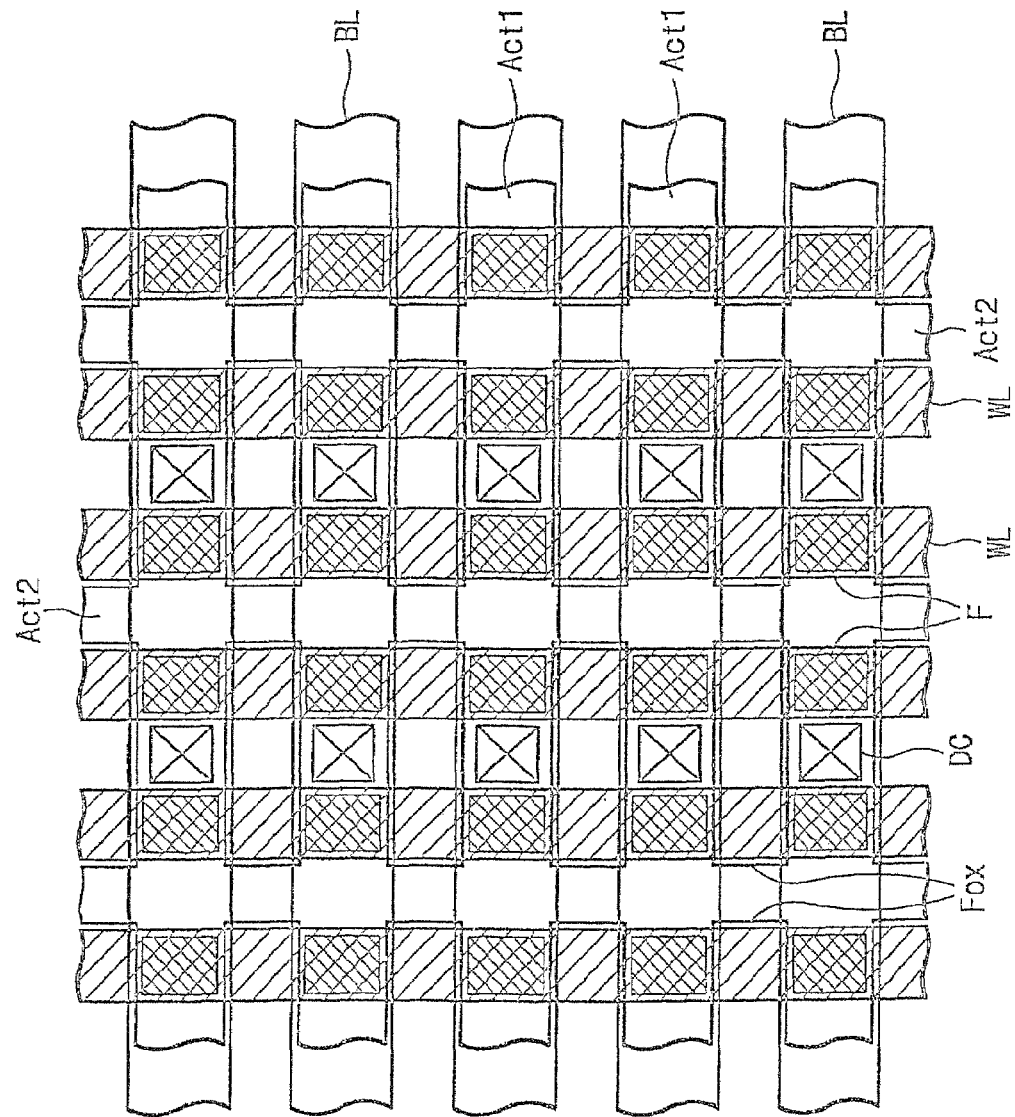
FIGS. 10 and 11 are top plan views of a portion of a cell array of the nonvolatile memory device according to the present invention.
Figure 11:
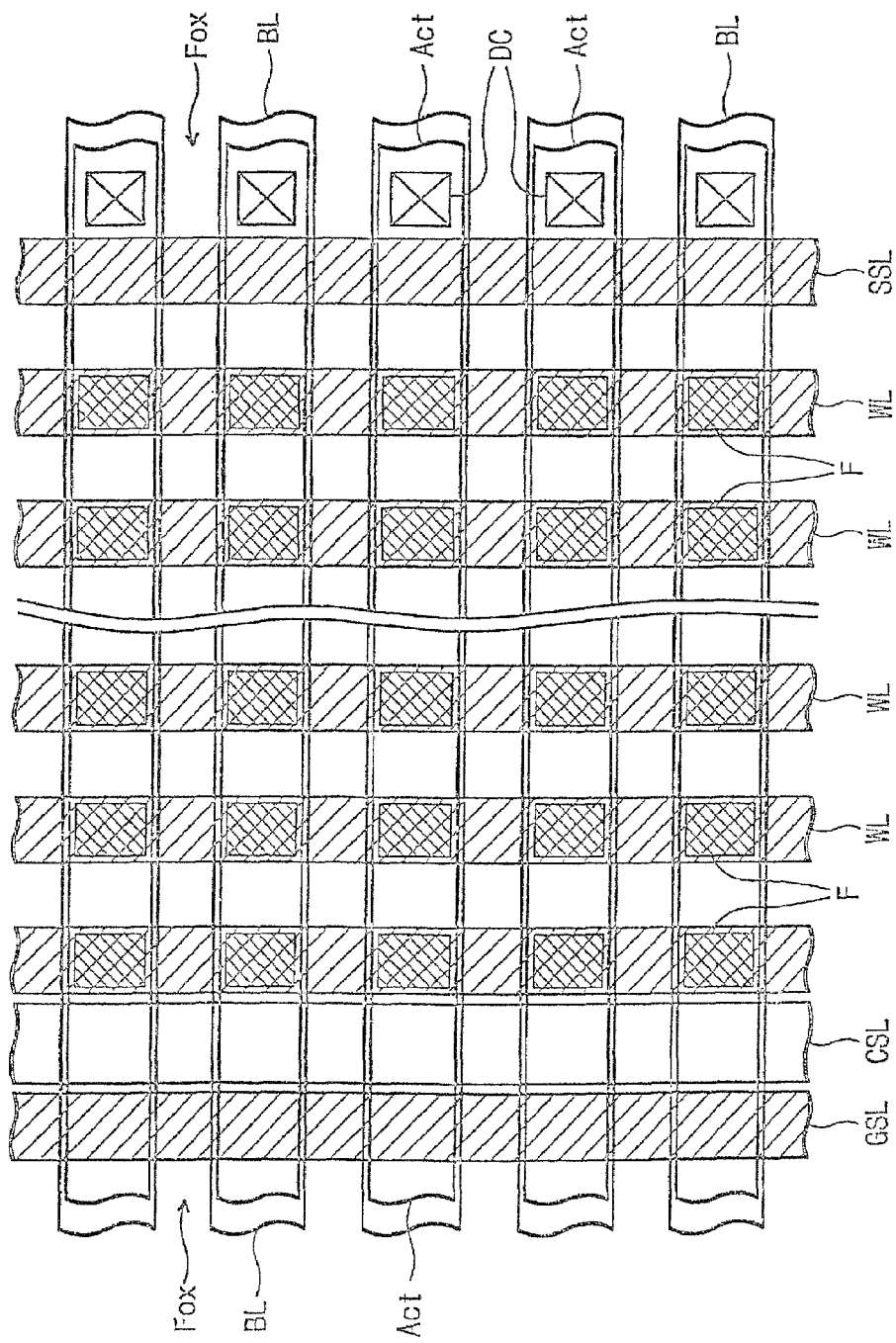

FIGS. 10 and 11 are top plan views of a portion of a cell array of the nonvolatile memory device according to the invention.

As illustrated in FIGS. 10 and 11, the cell of the nonvolatile memory device constitutes a NOR-type cell array or a NAND-type cell array.

Referring to FIG. 10, a NOR-type cell array includes a plurality of first active regions Act1 disposed parallel to each other on a semiconductor substrate. A plurality of second active regions Act2 is disposed across the first active regions Act1. A device isolation layer Fox is disposed in each of the regions between the first active regions Act1 and the second active regions Act2. A pair of word lines WL is disposed between the second active regions Act2 to cross the first active regions Act1. The second active regions Act2 correspond to a common source region, and each first active region Act1 between the word lines WL corresponds to a drain region. Although not shown in FIG. 10, an entire surface of the semiconductor substrate is covered with an interlayer insulation layer. Bit lines BL are disposed on the interlayer insulation layer in parallel with the first active regions Act1, and each bit line BL is connected to the drain region underneath it through a bit line plug DC. A floating gate F is located between each active region Act and each word line WL. A tunnel oxide layer (not shown) is located between the first active regions Act1 and the floating gate F. A gate interlayer dielectric layer (not shown) and a control gate electrode (not shown) are stacked between the floating gate F and the word line W. The tunnel oxide layer, the floating gate F, the gate interlayer insulation layer, and the control gate electrode are sequentially stacked between the device isolation layers as previously described with reference to FIGS. 9A and 9B.

In the NOR-type cell array, the second active regions Act2 may be formed simultaneously with the first active regions Act1. Alternatively, after forming the word lines WL, the device isolation layers between the first active regions Act1 may be removed to form the second active regions Act2.

Referring to FIG. 11, a NAND-type cell array includes a device isolation layer Fox disposed at a semiconductor substrate to define a plurality of parallel active regions Act. A common source line CSL is disposed across the active regions Act, and a bit line plug DC is connected to each active region Act. The bit line plugs DC are arranged in a row across the active regions Act. A ground selection line GSL and a string selection line SSL are disposed between the common source line CSL and the bit line plugs DC. The ground selection line GSL and the string selection line SSL cross over the active regions Act in parallel with the common source line CSL. A plurality of word lines WL is disposed between the ground selection line GSL and the string selection line SSL. A floating gate F is located between each active region Act and each word line WL. The common source line CSL is connected to each active region underneath it.

According to the invention described above, the step coverage between a cell array region and a peripheral circuit region is reduced. As a result, fabricating processes are stabilized. Furthermore, a height of a floating gate is reduced, decreasing the parasitic capacitance.

We claim:

1. A cell of a nonvolatile memory device, comprising:
   a plurality of trench isolation layers in parallel with each other on a predetermined region of a semiconductor substrate and defining a plurality of active regions;

the trench isolation layer having sidewalls that project over the semiconductor substrate; and a tunnel oxide layer, a floating gate and a gate interlayer dielectric layer that are sequentially stacked between the trench isolation layers, wherein the gate interlayer dielectric layer includes at least one high k-dielectric layer whose dielectric constant is higher than that of a silicon nitride layer, wherein the tunnel oxide layer, the floating gate and the gate interlayer dielectric layer have sidewalls that are self-aligned to the adjacent trench isolation layers, and wherein the self-aligned sidewall of the gate interlayer dielectric layer connects an uppermost surface of the gate interlayer dielectric layer with a lowermost surface of the gate interlayer dielectric layer.

2. The cell of claim 1, wherein the high k-dielectric layer is composed of a material selected from the group consisting of aluminum oxide, yttrium oxide, tantalum pentaoxide, vanadium pentaoxide, hafnium aluminate, and hafnium silicate.

3. The cell of claim 1, wherein the high k-dielectric layer is composed of a material obtained by doping a material selected from the group consisting of aluminum oxide, yttrium oxide, tantalum pentaoxide, and vanadium pentaoxide with a material selected from the group consisting of zirconium, silicon, titanium, and hafnium.

4. The cell of claim 1, wherein the gate interlayer dielectric layer additionally comprises:

a silicon oxide layer between the high k-dielectric layer and the floating gate.

5. The cell of claim 1, wherein the gate interlayer dielectric layer additionally comprises:

a silicon oxide layer on the high k-dielectric layer.

6. The cell of claim 1, wherein the gate interlayer dielectric layer additionally comprises:

a first silicon oxide layer on the high k-dielectric layer; and a second silicon oxide layer between the high k-dielectric layer and the floating gate.

7. The cell of claim 1, wherein the tunnel oxide layer, the floating gate and the gate interlayer dielectric layer have sidewalls that are entirely in contact with sidewalls of the adjacent device isolation layers.

8. The cell of claim 1, wherein the tunnel oxide layer, the floating gate and the gate interlayer dielectric layer have sidewalls that are self-aligned to sidewalls of the adjacent trench isolation layers.

9. The cell of claim 1, wherein an uppermost surface of the gate interlayer dielectric layer is below uppermost surfaces of the trench isolation layers.

10. The cell of claim 1, wherein a sidewall of the gate interlayer dielectric layer is below upper surfaces of the trench isolation layers.

* * * * *